United States Patent [19]

Stumpf et al.

[11] Patent Number: 4,488,581
[45] Date of Patent: Dec. 18, 1984

[54] TERMINAL ALIGNMENT TOOL
[75] Inventors: Harry M. Stumpf, Hershey; John A. Woratyla, Camp Hill, both of Pa.
[73] Assignee: AMP Incorporated, Harrisburg, Pa.
[21] Appl. No.: 496,045
[22] Filed: May 19, 1983
[51] Int. Cl.³ .............................................. B21F 1/02
[52] U.S. Cl. ...................................... 140/147; 29/741
[58] Field of Search ................... 140/147; 72/385, 454, 72/384; 29/882, 884, 739, 741, 747, 564.1

[56] References Cited
U.S. PATENT DOCUMENTS

| | | | |
|---|---|---|---|
| 1,860,171 | 5/1932 | Bynum | 72/454 |
| 3,106,945 | 10/1963 | Wright et al. | 140/147 |
| 3,333,338 | 8/1967 | Burns | 30/233 |
| 3,538,580 | 11/1970 | Bruner | 29/33 T |
| 3,896,533 | 7/1975 | Ullman et al. | 29/203 B |

Primary Examiner—Francis S. Husar
Assistant Examiner—Linda McLaughlin
Attorney, Agent, or Firm—Russell J. Egan; Allan B. Osborne

[57] ABSTRACT

An alignment tool is formed by a pair of mutually interacting comb-like members which, in the open position, receive a plurality of pin terminals depending from a connector between the tines and, in the closed position, the tines engage the pin terminals from opposite sides in trapping them and forcing them to a correct aligned position. After mounting of the terminals into respective apertures of a circuit board or the like the tool is released and, because of its relatively thin dimensions, can be readily removed from between mounted and mounting members.

1 Claim, 6 Drawing Figures

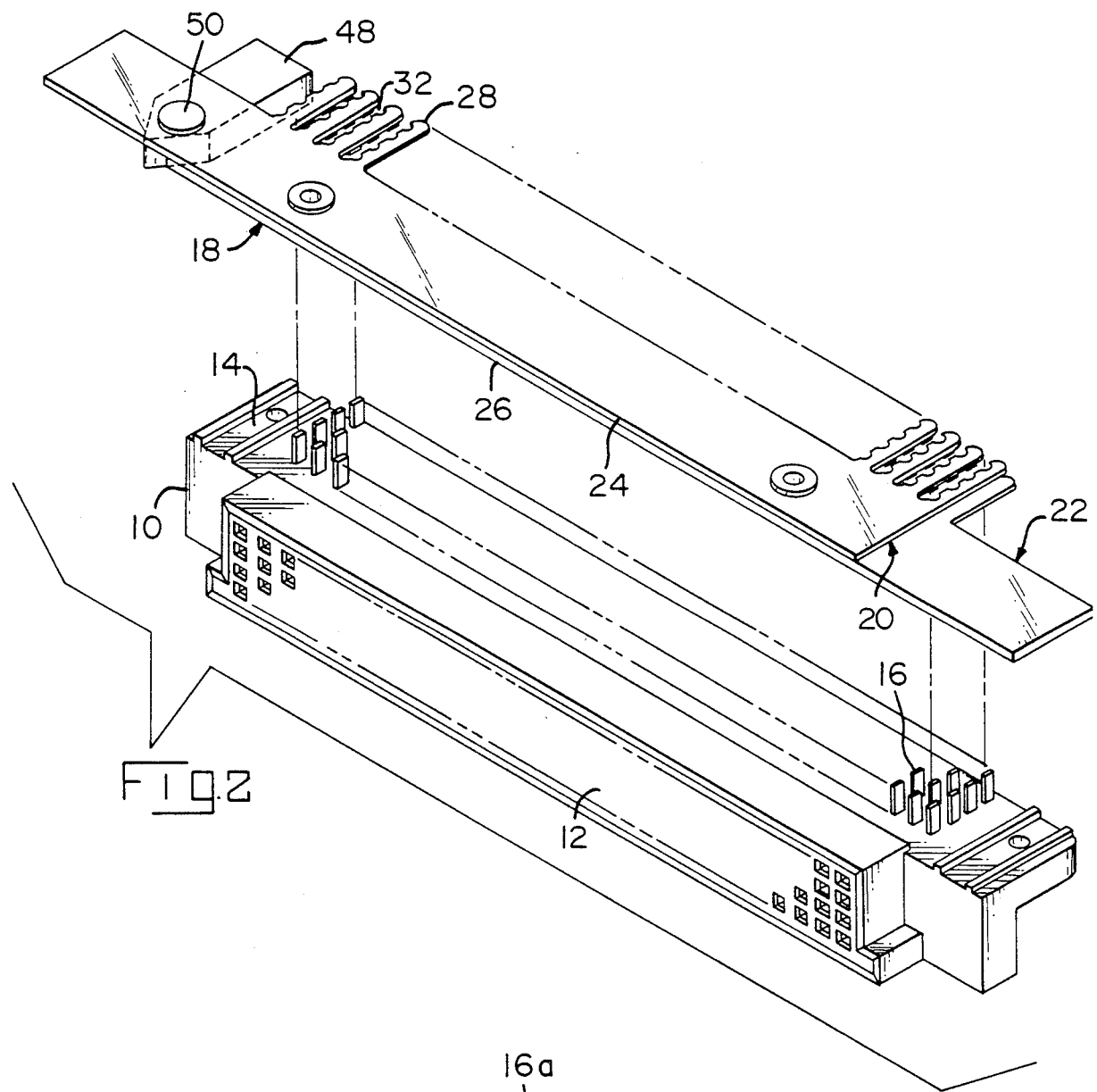
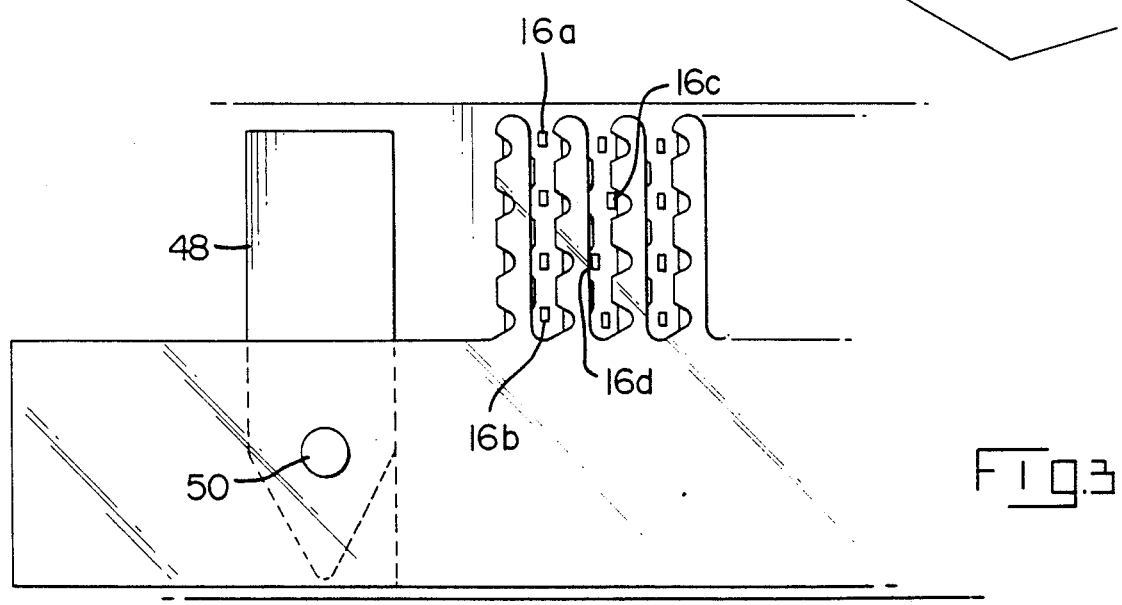

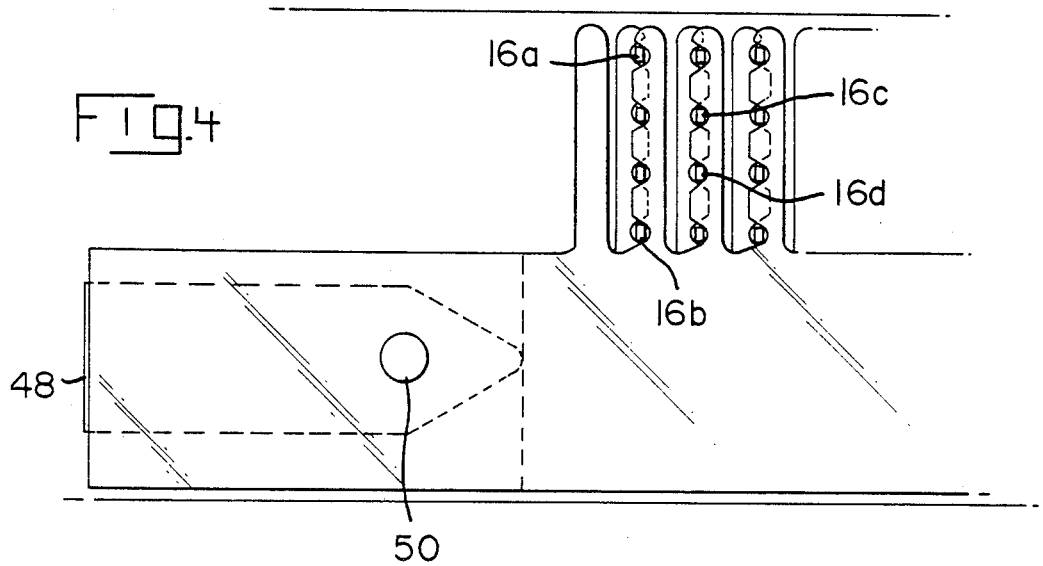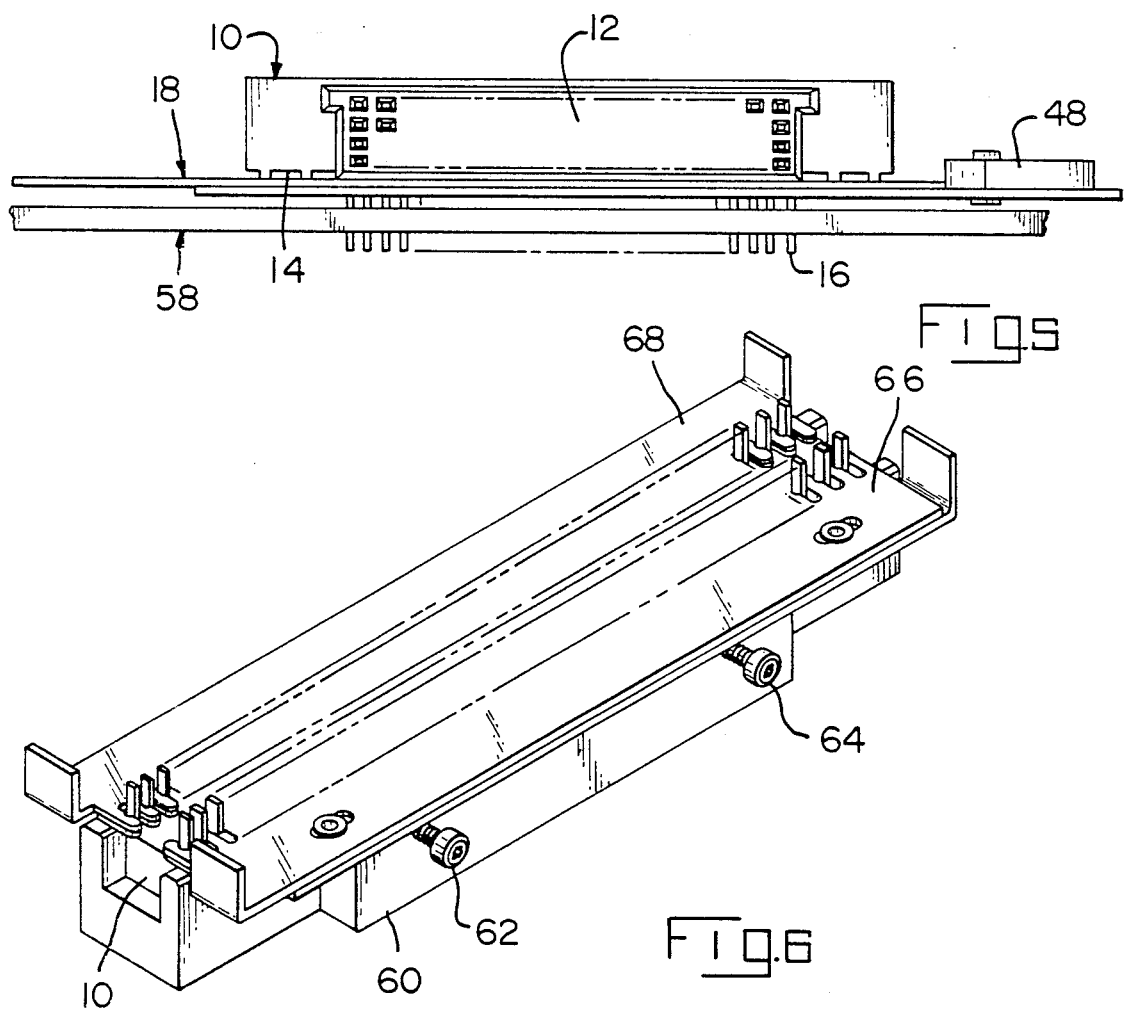

TERMINAL ALIGNMENT TOOL

The present invention relates to terminal alignment tool and in particular to a tool for properly aligning a plurality of pin terminals depending in multiple rows from an electrical connector into alignment for insertion into a like array of apertures in a circuit board or the like.

The current requirement for electrical connectors includes having a high density array of terminals in a small space. This has caused the development of pin headers and the like which can be of substantial size and have an extraordinarily high number of terminals therein. For example, there is a pin header currently being manufactured that is 18 inches in length, less than one-half inch in width and contains 720 terminals arranged in four parallel rows of 180 terminals per row. It is extremely difficult to mount such a pin header on a circuit board or the like since minor misalignment of any of the terminals in any of the rows can cause great difficulty and prevent proper insertion. The problem is somewhat less in a tow row connector where the pins of a first row can be angled into the first row of apertures and the second row pushed into the next row of apertures, aligning the terminals as necessary. This becomes completely impossible when there are multiple rows making the inner rows almost inaccessible.

The present invention concerns an alignment tool formed by a pair of elongated comb-like members which, when moved transversely with respect to each, other open to receive and then close to engage and align the respective multiple terminals depending from a pin header or the like. A cam or lever actuation member can be provided pivotally secured to one of the comb-like members to act on the other member to effect the relative transverse motion.

An embodiment of the present invention will now be described by way of example with reference to the accompanying drawings in which:

FIG. 2 is a perspective view showing the subject tool positioned above pin terminals of a pin header;

FIG. 3 is a plan view of an end portion of the subject tool in an open position receiving therein multiple pin terminals of a pin header;

FIG. 4 is a plan view similar to FIG. 3 showing the subject tool in a closed condition driving the pin terminals into proper alignment;

FIG. 5 is a side elevation showing the subject tool still positioned between a pin header and a circuit board after insertion of the pin terminals; and FIG. 6 is a perspective view of an alternate embodiment of the present invention together with a pin header and a header straightening jig.

Figure 1:
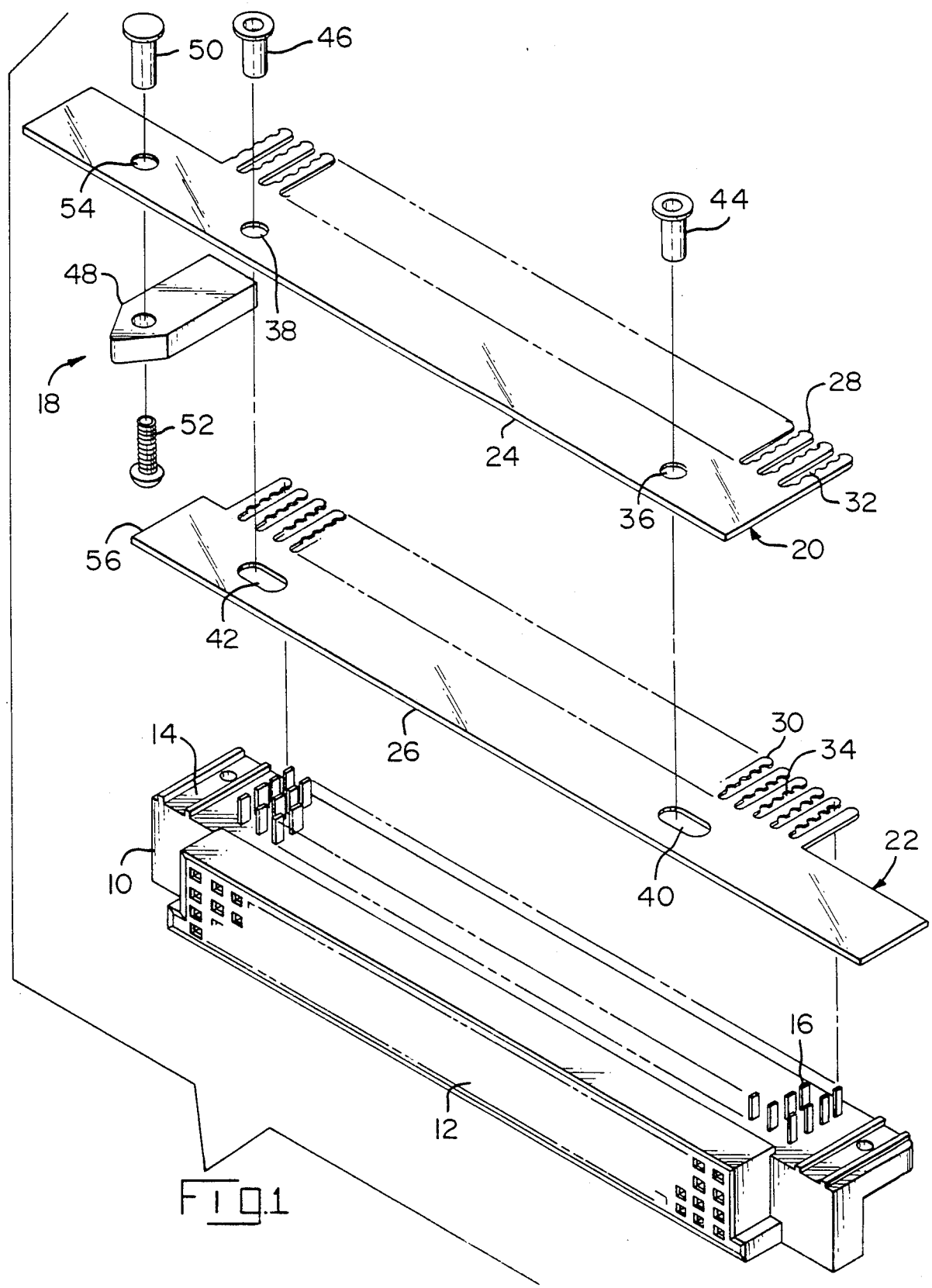
FIG. 1 is an exploded perspective view of the subject invention and a pin header.

The header 10 shown in FIGS. 1 and 2 is of any known type and has a mating face 12 and a mounting face 14 with a plurality of terminals mounted therein, each terminal having a pin portion 16 extending from the mounting face 14 and a mating portion (not shown) directed toward the mating face. It will be noted from the Figures that the terminals are in a high density, multiple row array. In this instance there are four rows and the assumption will be that they are on the ordor of 720 total terminals in a header which has a length of 18 inches and a width of less than one-half inch.

The subject tool 18 is formed by a first and second comb members 20, 22, each of which has a body portion 24, 26 with a plurality of profiled teeth 28, 30 extending in parallel fashion from one marginal edge thereof. It should be noted that the teeth are profiled with a series of notches 32, 34 which are oppositely directed on the two comb members 20, 22 so that in the closed condition, as shown in FIG. 4, the notches will form a terminal entrapment cavity. Member 20 has a pair of round apertures 36, 38 while member 22 has a pair of elongated apertures 40, 42. A pair of rivets 44, 46 are passed through the respective apertures 36, 38, 40, 42 and secured to hold the members 20, 22 together while allowing limited relative transverse movement. A cam member 48 is secured by pivot pin 50 and screw 52 to aperture 54 in the first member 20 and acts against the reaction surface 56 of the second member.

In operation the tool 18 would be moved to its open position, as shown in FIGS. 2 and 3, and placed loosely over the array of terminals 16. It will be noted, from FIG. 3, that the terminals 16 can be misaligned in the lateral or transverse directions as noted by terminals 16a, 16b, 16c, and 16d illustrating several rather extreme cases. Actuation of the cam 48 drives the members 20, 22 relative to each other to the closed position, as shown in FIG. 4. It is readily apparent from this Figure that the movement of the members caused the formation of a number of accurately aligned cavities, each of which holds a terminal entrapped therein and forced into the correct alignment position. It is now only necessary to place the header over a circuit board or the like with the terminals properly aligned with respect to apertures. Insertion of the terminals into the respective apertures is quite easy now since they are accurately aligned as shown in FIG. 5. Once the terminals 16 are inserted into the circuit board 58 the cam 48 is rotated to the released position, shown in FIG. 3, the comb members moved relative to each other to the open position. The tool 16 can then be slipped between the header 10 and the circuit board 58 with ease, as can be appreciated from FIG. 5. The header 10 can then be driven all the way against the circuit board 58 and the terminals 16 secure thereto by soldering or other known means.

The tool 18 as illustrated can only be moved to the open position manually. However, it is within the scope of the present invention to arrange parallel spaced reaction surfaces on member 22 so that rotation of the cam 48 will drive the members to both the open and closed positions.

An alternate embodiment of the subject tool is shown in FIG. 6 together with a header straightening member. It often happens that molded parts of substantial length will develop a warp from the molding operation. This must be removed or reduced to achieve ease in mounting such a warped header. In this case the header 10 is placed in a channel member 60 and straightened by screws 62, 64. Then alignment tools, in this case a pair of tools 66, 68 are applied to the terminals and closed to drive them into correct alignment. Insertion of the header is accomplished in the same manner as previously described and the tools 66, 68 and member 60 removed.

We claim:

1. An alignment tool for aligning a plurality of terminals extending from a housing in a high density array of a plurality of parallel spaced rows, said tool comprising:
   a pair of rigid comb members, each having a body portion and a plurality of parallel spaced tines extending from one marginal edge thereof, each tine having a profile on one elongated side with the tines of the two members being profiled on opposite elongated sides to define a series of cavities;

means securing said comb members together in superimposed fashion with the tines extending in a common direction, said means allowing limited relative transverse movement of the members whereby in an open condition rows of terminals are received between said tines and in the closed position said tines form entrapment cavities aligning the terminals in their correct respective position; and a cam actuater rotatably mounted on one of said members and having a cam surface engageable with a cooperating surface on the other of said members whereby relative transverse movement of both members occurs by rotating said actuater.

* * * * *